(12) United States Patent
Sasaki

(10) Patent No.: US 9,077,291 B2
(45) Date of Patent: Jul. 7, 2015

(54) POWER AMPLIFIER

(71) Applicant: Yoshinobu Sasaki, Tokyo (JP)

(72) Inventor: Yoshinobu Sasaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 95 days.

(21) Appl. No.: 13/832,334

(22) Filed: Mar. 15, 2013

(65) Prior Publication Data

US 2014/0015613 A1    Jan. 16, 2014

(30) Foreign Application Priority Data

Jul. 11, 2012    (JP) .................................. 2012-155841

(51) Int. Cl.
| | |
|---|---|
| *H03F 3/21* | (2006.01) |
| *H03F 1/02* | (2006.01) |
| *H03F 3/24* | (2006.01) |
| *H03F 3/72* | (2006.01) |

(52) U.S. Cl.
CPC ................ *H03F 3/21* (2013.01); *H03F 1/0261* (2013.01); *H03F 3/245* (2013.01); *H03F 3/72* (2013.01); *H03F 2200/18* (2013.01); *H03F 2200/27* (2013.01); *H03F 2200/411* (2013.01); *H03F 2203/7206* (2013.01)

(58) Field of Classification Search
USPC .................................. 330/285, 296, 277, 273
See application file for complete search history.

(56) References Cited

U.S. PATENT DOCUMENTS

| | | | |
|---|---|---|---|
| 6,549,076 B2 * | 4/2003 | Kuriyama | ..................... 330/296 |
| 2005/0212603 A1 | 9/2005 | Aoki | |

FOREIGN PATENT DOCUMENTS

| | | |
|---|---|---|
| JP | 2004-134826 A | 4/2004 |
| KR | 10-2007-0045827 A | 5/2007 |

OTHER PUBLICATIONS

Korean Patent Office; Office Action in corresponding Korean patent application No. 10-2013-0069422 (May 23, 2014).

* cited by examiner

*Primary Examiner* — Hieu Nguyen
(74) *Attorney, Agent, or Firm* — Leydig, Voit & Mayer, Ltd.

(57) ABSTRACT

A power amplifier includes: an amplifier having an input terminal and including an amplifying transistor having a threshold voltage; a transistor supplying a bias to the input terminal of the amplifier according to an on/off signal; a capacitor connected between the input terminal of the amplifier and a grounding point; a resistor connected between the input terminal of the amplifier and the grounding point, in parallel with the capacitor; and a diode connected in series with the resistor. The diode has a threshold voltage that is lower than the threshold voltage of the amplifying transistor.

2 Claims, 5 Drawing Sheets

POWER AMPLIFIER

BACKGROUND OF THE INVENTION

1. Field of the Invention

The present invention relates to a power amplifier for use in a portable telephone terminal or the like.

2. Background Art

A bias circuit of a power amplifier has a transistor that supplies a bias to the base of the amplifier according to an on/off signal. Also, a capacitor connected between the base of the amplifier and a grounding point is provided for the purpose of reducing low-frequency noise (see, for example, Japanese Patent Laid-Open No. 2004-134826). At the moment at which the on/off signal is changed from the on signal to the off signal, the amplifier is still maintained in the on state by electric charge accumulated in the capacitor. Thereafter, when the electric charge in the capacitor is discharged through a resistor, the amplifier is turned off.

SUMMARY OF THE INVENTION

In the conventional bias circuit, even when the amplifier is off, a certain current flows through a resistor due to a leakage current that flows through the transistor when the transistor is off. The power consumption is increased thereby. However, there is a need to limit the current flowing through the power amplifier for a portable telephone during standby to 10 µA or less in order to increase the standby time of the portable telephone.

If the resistance value of the resistor is increased in order to reduce the power consumption, the time required for discharge is increased and the switching speed is reduced. In the case of a power amplifier for a portable telephone, however, turning off in a time of several microseconds or less is required.

In view of the above-described problems, an object of the present invention is to provide a power amplifier which can reduce the power consumption and increase the switching speed.

According to the present invention, a power amplifier comprises: an amplifier having an input terminal; a transistor supplying a bias to the input terminal of the amplifier according to an on/off signal; a capacitor connected between the input terminal of the amplifier and a grounding point; a resistor connected between the input terminal of the amplifier and a grounding point in parallel with the capacitor; and a diode connected in series with the resistor. A startup voltage across the diode is lower than on voltage of the amplifier.

The present invention makes it possible to reduce the power consumption and increase the switching speed.

Other and further objects, features and advantages of the invention will appear more fully from the following description.

DETAILED DESCRIPTION OF THE PREFERRED EMBODIMENTS

A power amplifier according to the embodiments of the present invention will be described with reference to the drawings. The same components will be denoted by the same symbols, and the repeated description thereof may be omitted.

First Embodiment

Figure 1:
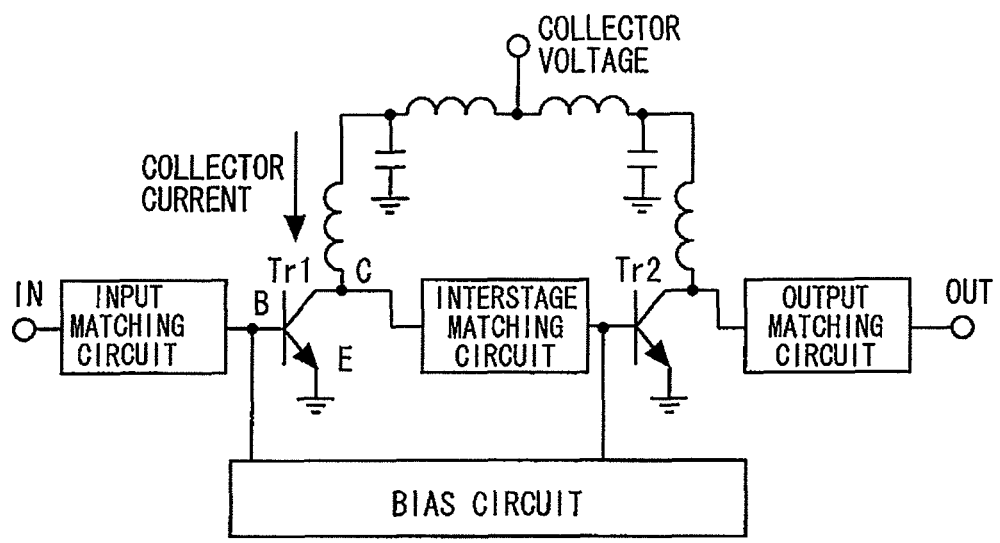
FIG. 1 is a diagram showing a power amplifier according to a first embodiment of the present invention.

FIG. 1 is a diagram showing a power amplifier according to a first embodiment of the present invention. This power amplifier is implemented in a portable telephone terminal or the like. An RF signal input through an input terminal IN is amplified by an initial-stage transistor Tr1 and a rear-stage transistor Tr2 to be output through an output terminal OUT. The power amplifier is assumed to be a two-stage amplifier in the present embodiment but it is not limited to the two-stage amplifier. The power amplifier may be a multi-stage amplifier having two or more stages. Each of the Tr1 and Tr2 is constituted by a GaAs-HBT.

A bias circuit supplies base currents to the bases of the Tr1 and Tr2. An input matching circuit is provided on the Tr1 input side. An interstage matching circuit is provided between the Tr1 and Tr2. An output matching circuit is provided on the Tr2 output side. A collector voltage of about 3.4 V is applied to the collectors of the Tr1 and Tr2. The emitters of the Tr1 and Tr2 are grounded.

Figure 2:
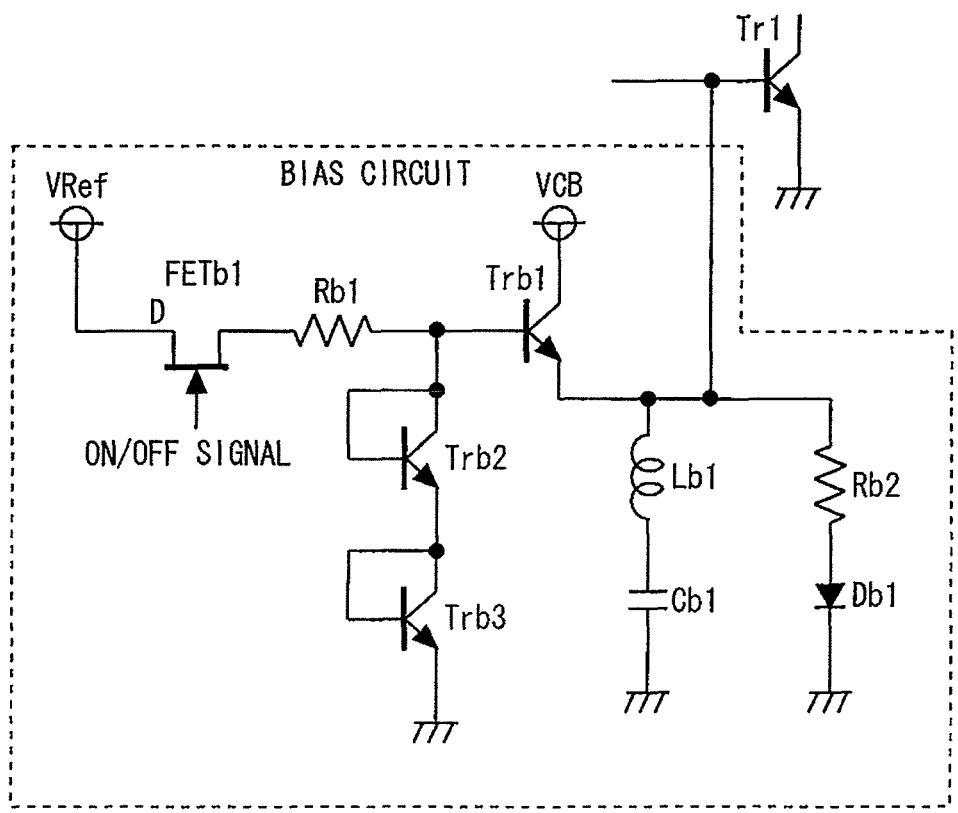
FIG. 2 is a diagram showing the bias circuit according to the first embodiment of the present invention.

FIG. 2 is a diagram showing the bias circuit according to the first embodiment of the present invention. While the configuration of the bias circuit for the initial-stage transistor Tr1 will be described here, the configuration of the bias circuit for the rear-stage transistor Tr2 is the same as that of the bias circuit for the initial-stage transistor Tr1.

The bias circuit has transistors Trb1, Trb2, and Trb3, which are GaAs-HBTs, a field-effect transistor FETb1, an inductor Lb1, a capacitor Cb1, resistors Rb1 and Rb2, and a GaAs Schottky diode Db1.

The FETb1 and the Rb1 are connected in series between the base of the Trb1 and a reference voltage terminal VRef. The Trb2 and Trb3 each connected in diode form are connected in series between the base of the Trb1 and a grounding point. The collector of the Trb1 is connected to a power supply terminal VCB. The emitter of the Trb1 is connected to the base of the Tr1.

The Lb1 and the Cb1 are connected in series between the base of the Tr1 and a grounding point. The Cb1 is a capacitor for reducing low-frequency noise. The capacitance value of the Cb1 is ordinarily 100 pF or higher (e.g., 1000 pF). The Rb2 is connected between the base of the Tr1 and a grounding point in parallel with the Cb1. The Rb2 is a resistor for discharging an electric charge in the Cb1 when the Tr1 is off.

The Db1 is connected in series with the Rb2. A startup voltage (threshold voltage) across the Db1 is set lower than the on voltage (threshold voltage) of the Tr1. For example, while the on voltage of the Tr1, which is a HBT, is about 1.2 V, the threshold voltage of the Db1 is 0.6 V.

The operation will now be described. When the on/off signal is an on signal (high), the FETb1 and the Trb1 are turned on and the desired base voltage is applied to the Tr1, so that the Tr1 is turned on. When the on/off signal is an off signal (low), the FETb1 and the Trb1 are turned off and the base voltage of the Tr1 is reduced, so that the Tr1 is turned off. The FETb1 and the Trb1 thus supply the bias to the base of the Tr1 according to the on/off signal.

At the moment at which the on/off signal is changed from the on signal to the off signal (high→low), the Tr1 is still maintained in the on state by electric charge accumulated in the Cb1. Thereafter, when the electric charge in the Cb1 is discharged through the Rb2 and the Db1, the Tr1 is turned off.

Since the startup voltage of the Db1 is lower than the on voltage of the Tr1, a current flows through the Db1 even after the Tr1 is turned off. After a lapse of a certain time period, and when discharge from the Cb1 has progressed, the current ceases to flow through the Db1. Since the Db1 is off when the Tr1 is off, substantially no current flows through the Rb1.

Figure 3:
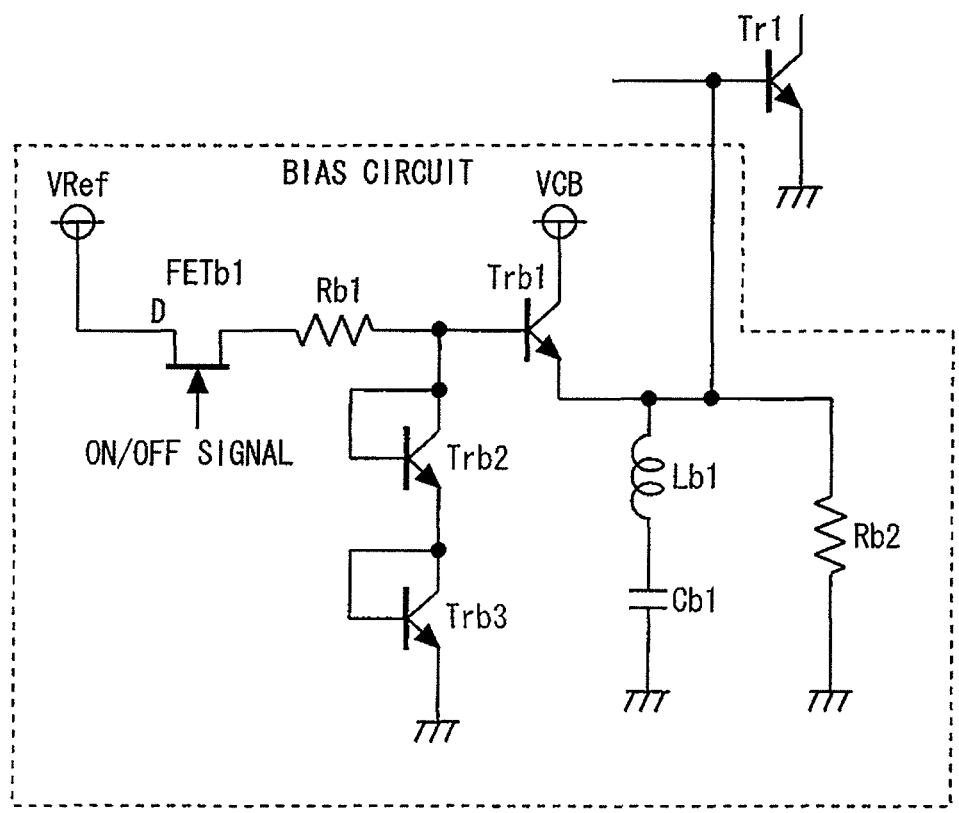
FIG. 3 is a diagram showing a bias circuit according to a comparative example.

The effect of the present embodiment will be described in comparison with a comparative example. FIG. 3 is a diagram showing a bias circuit according to a comparative example. In the comparative example, the Db1 is not provided. Therefore, even when the Tr1 is off, a certain current flows through the Rb2 due to a leakage current through the Trb1 in the off state and the power consumption is increased. If the resistance value of the Rb2 is increased for the purpose of reducing the power consumption, the time required for discharge is increased and the switching speed is reduced.

On the other hand, in the present embodiment, because of the provision of the Db1, no current flows through the Rb2 when the Tr1 is off. Thus, the power consumption can be reduced. Also, since there is no need to increase the resistance value of the Rb2 for the purpose of reducing the power consumption, electric charge in the Cb1 can be rapidly discharged and the switching speed can be increased.

The Db1 is not limited to the GaAs Schottky diode. The Db1 may be any other kind of diode if its threshold voltage is lower than the on voltage of the Tr1. For example, the Db1 may be a diode formed by the base and the emitter layer of an HBT.

Second Embodiment

Figure 4:
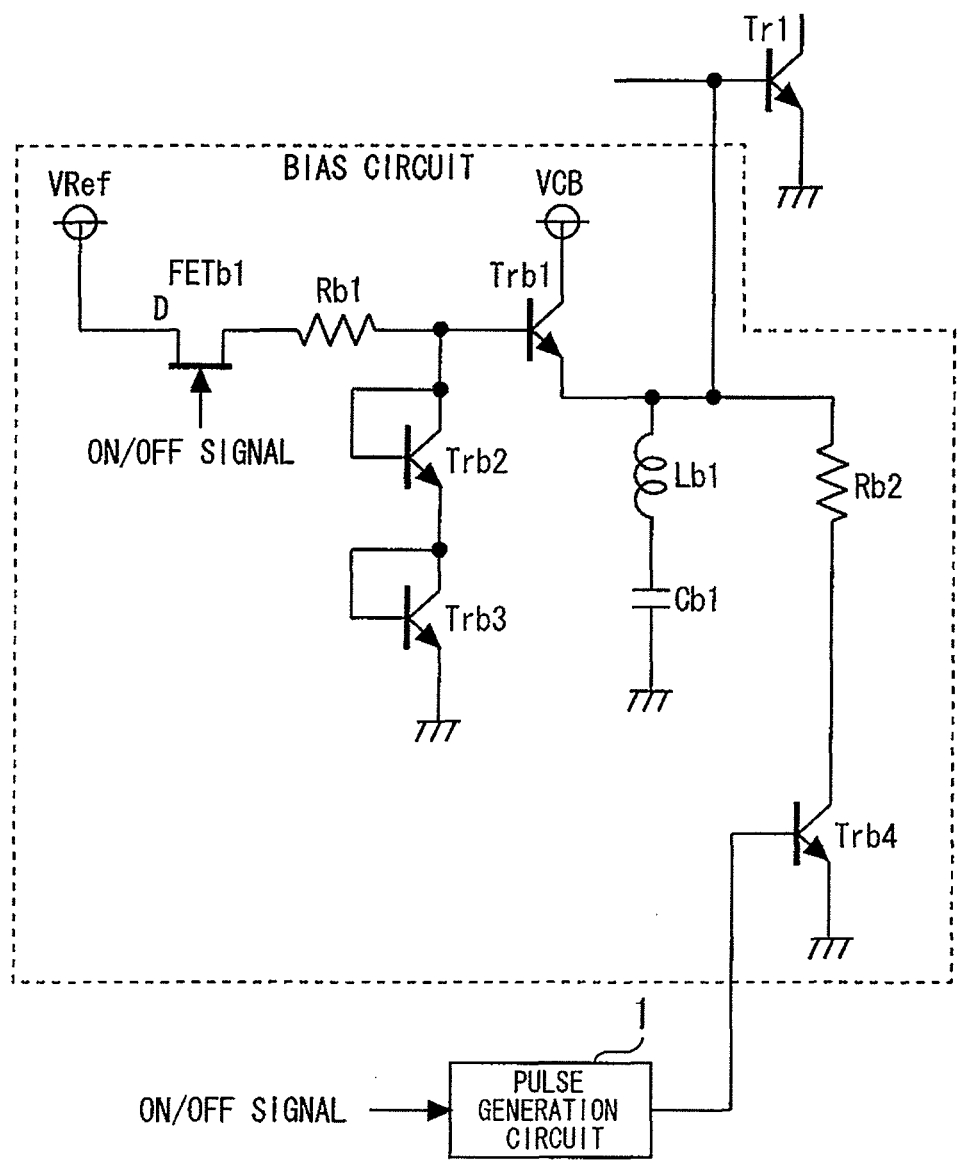
FIG. 4 is a diagram showing a bias circuit according to a second embodiment of the present invention.

FIG. 4 is a diagram showing a bias circuit according to a second embodiment of the present invention. A switch Trb4, which is a GaAs-HBT, is connected in series with the Rb2 in place of the Db1 in the first embodiment. A pulse generation circuit 1 is provided outside the bias circuit.

Figure 5:
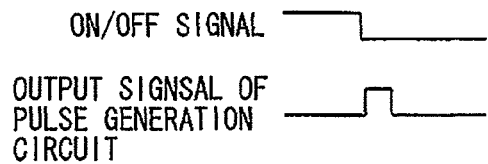
FIG. 5 is a timing chart showing a control signal in the second embodiment of the present invention.

FIG. 5 is a timing chart showing a control signal in the second embodiment of the present invention. The pulse generation circuit 1 outputs a pulse signal (high) when the on/off signal is changed from the on signal to the off signal (high→low). By this pulse signal, the switch Trb4 is maintained in the on state for a certain time period, during which electric charge accumulated in the Cb1 is discharged. After discharge of this electric charge is completed, the Trb4 is again turned off and the current ceases to flow. Thus, the power consumption can be reduced. Also, since there is no need to increase the resistance value of the Rb2 for the purpose of reducing the power consumption, electric charge in the Cb1 can be rapidly discharged and the switching speed can be increased.

Third Embodiment

Figure 6:
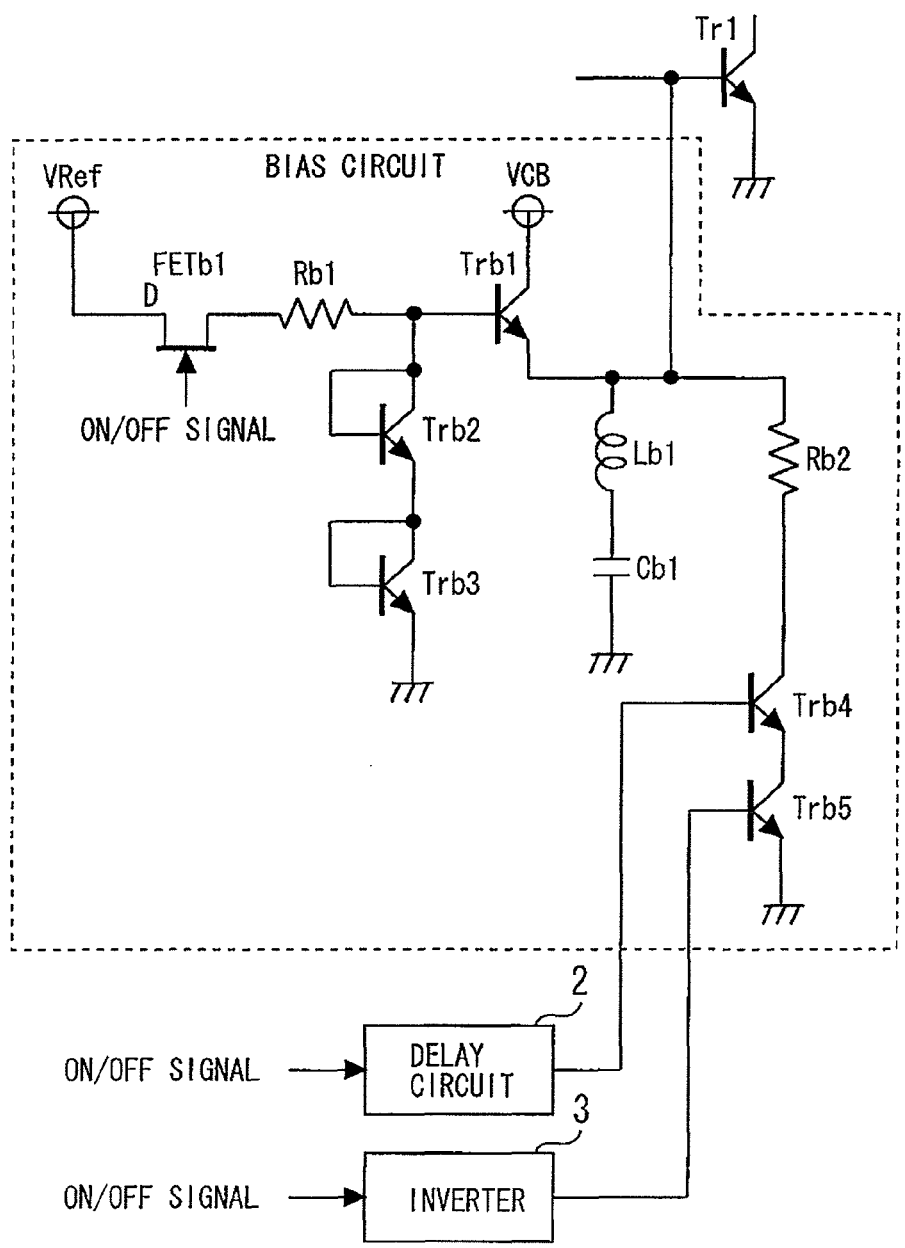
FIG. 6 is a diagram showing a bias circuit according to a third embodiment of the present invention.

FIG. 6 is a diagram showing a bias circuit according to a third embodiment of the present invention. Switches Trb4 and Trb5, which are GaAs-HBTs, are connected in series with the Rb2 in place of the Db1 in the first embodiment. A delay circuit 2 and an inverter 3 are provided outside the bias circuit.

Figure 7:
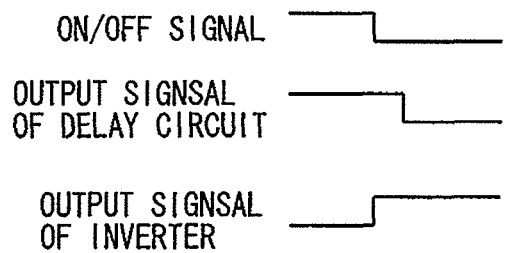
FIG. 7 is a timing chart showing control signals in the third embodiment of the present invention.

FIG. 7 is a timing chart showing control signals in the third embodiment of the present invention. The delay circuit 2 controls turning on/off of the Trb4 by means of a signal obtained by delaying the on/off signal through a certain time period. The inverter 3 controls turning on/off of the Trb5 by means of a signal obtained by inverting the on/off signal. Both the Trb4 and the Trb5 are thereby turned on and maintained in the on state for a certain time period after the on/off signal is changed from the on signal to the off signal. During this time period, electric charge accumulated in the Cb1 is discharged. After discharge of this electric charge is completed, the Trb4 is again turned off and the current ceases to flow. Thus, the power consumption can be reduced. Also, since there is no need to increase the resistance value of the Rb2 for the purpose of reducing the power consumption, electric charge in the Cb1 can be rapidly discharged and the switching speed can be increased.

Fourth Embodiment

Figure 8:
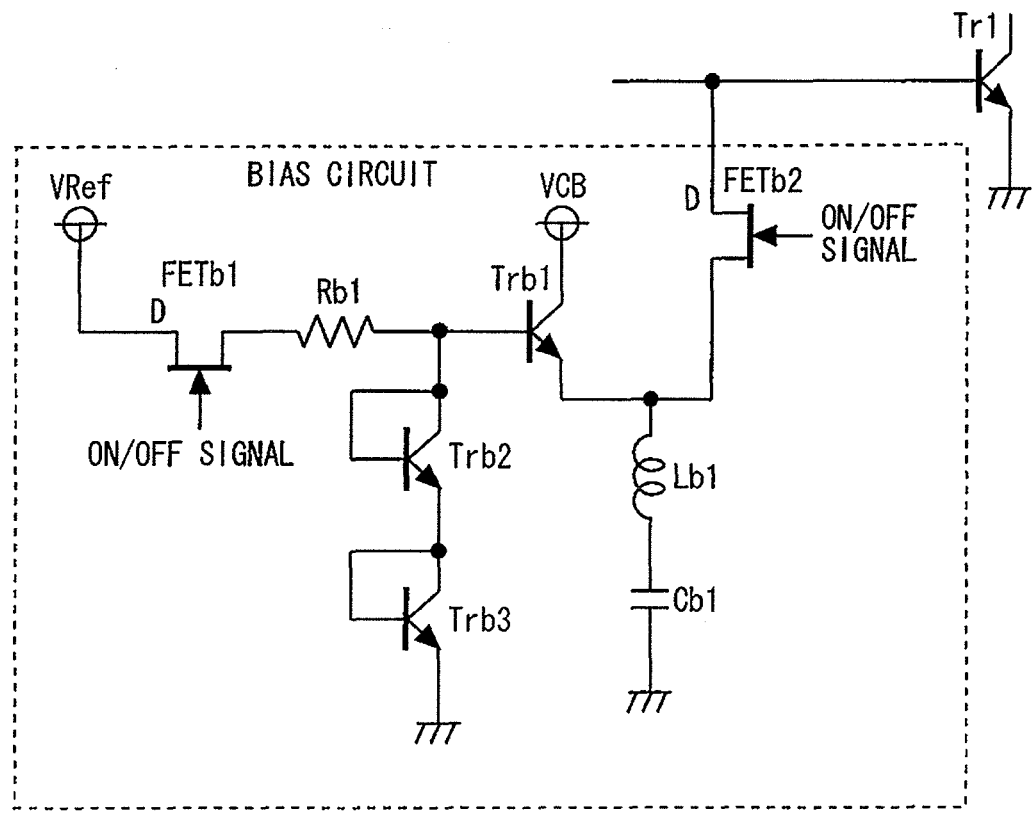
FIG. 8 is a diagram showing a bias circuit according to a fourth embodiment of the present invention.

FIG. 8 is a diagram showing a bias circuit according to a fourth embodiment of the present invention. A field-effect transistor FETb2 is provided in place of the Rb2 and the Db1 in the first embodiment and connected between the base of the Tr1 and the capacitor Cb1.

The switch FETb2 is turned on/off according to the on/off signal. Accordingly, when the on/off signal is set to the off signal, the FETb2 is turned off to disconnect between the Tr1 and the bias circuit. While electric charge in the Cb1 is not discharged thereby, the bias circuit and the Tr1 are disconnected, so that the Tr1 is turned off in a moment. Thus, the switching speed can be increased. Also, since the resistor Rb2 as in the first embodiment can be omitted, the current ceases to flow when the amplifier Tr1 is turned off. Thus, the power consumption can be reduced.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-155841, filed on Jul. 11, 2012, including specification, claims, drawings, and summary, on which the Convention priority of the present application is based, is incorporated herein by reference in its entirety.

What is claimed is:

1. A power amplifier comprising:
   an amplifier having an input terminal and including an amplifying transistor having a threshold voltage;
   a transistor supplying a bias to the input terminal of the amplifier according to an on/off signal;
   a capacitor connected between the input terminal of the amplifier and a grounding point;
   a resistor connected between the input terminal of the amplifier and the grounding point, in parallel with the capacitor; and
   a diode connected in series with the resistor, wherein
       the diode has a threshold voltage that is lower than the threshold voltage of the amplifying transistor, and
       the diode turns off after the transistor turns off.

2. The power amplifier of claim 1, wherein the amplifying transistor is a HBT and the diode is a Schottky diode.

* * * * *